United States Patent
Maier et al.

(10) Patent No.: US 8,643,480 B2
(45) Date of Patent: Feb. 4, 2014

(54) INPUT DEVICE WITH HAPTIC FEEDBACK

(75) Inventors: Ferdinand Maier, Obertrum am See (AT); Thomas Fischer, Bayerisch Gmain (DE)

(73) Assignee: FM Marketing GmbH (AT)

( * ) Notice: Subject to any disclaimer, the term of this patent is extended or adjusted under 35 U.S.C. 154(b) by 132 days.

(21) Appl. No.: 13/426,326

(22) Filed: Mar. 21, 2012

(65) Prior Publication Data
US 2012/0242464 A1    Sep. 27, 2012

(30) Foreign Application Priority Data
Mar. 22, 2011 (DE) .......... 10 2011 014 763

(51) Int. Cl.
*G08B 6/00* (2006.01)
(52) U.S. Cl.
USPC .......... 340/407.2; 340/407.1; 341/22; 341/32
(58) Field of Classification Search
USPC .................. 340/407.1, 407.2; 341/22, 32
See application file for complete search history.

(56) References Cited

U.S. PATENT DOCUMENTS

| | | | |
|---|---|---|---|
| 5,504,502 A | 4/1996 | Arita et al. | |
| 5,698,976 A | 12/1997 | Nakajima et al. | |
| 6,266,046 B1 | 7/2001 | Arita | |
| 6,509,888 B1 | 1/2003 | Tuovinen et al. | |
| 6,723,937 B2 | 4/2004 | Englemann et al. | |
| 6,762,748 B2 | 7/2004 | Maattaet et al. | |
| 7,187,360 B2 * | 3/2007 | Suzuki et al. ............. | 345/160 |
| 7,310,081 B2 | 12/2007 | Nakamura et al. | |
| 7,489,296 B2 | 2/2009 | Nishino et al. | |
| 7,504,598 B2 | 3/2009 | Weigold | |
| 7,642,886 B2 | 1/2010 | Boss | |
| 7,737,945 B2 * | 6/2010 | West et al. ............. | 345/157 |
| 7,898,523 B1 | 3/2011 | Van Meter | |
| 2002/0054012 A1 | 5/2002 | Endo et al. | |
| 2002/0125977 A1 | 9/2002 | VanZoest | |
| 2004/0252104 A1 | 12/2004 | Nakamura et al. | |
| 2005/0068134 A1 | 3/2005 | Nishino et al. | |
| 2006/0209019 A1 | 9/2006 | Hu | |
| 2009/0273423 A1 | 11/2009 | Kramlich et al. | |
| 2012/0068834 A1 * | 3/2012 | Lee et al. ............. | 340/407.1 |

FOREIGN PATENT DOCUMENTS

| | | |
|---|---|---|
| DE | 19962789 A1 | 7/2001 |
| DE | 102010012247 A1 | 9/2011 |
| DE | 102010019596 A1 | 11/2011 |

(Continued)

OTHER PUBLICATIONS

Abstract of JP6318134; Nov. 15, 1994.

(Continued)

*Primary Examiner* — Travis Hunnings
(74) *Attorney, Agent, or Firm* — Senniger Powers LLP

(57) ABSTRACT

An input device with a housing which includes a displaceable cover wall attached to a circuit board to which is affixed a displaceable magnetic part, at least one sensor and a microprocessor; a second magnetic part which is permanently fixed relative to the housing cooperates with the displaceable magnetic part and, upon displacement of the cover wall, generates a haptically perceptible force; the position of the cover wall relative to the housing is detected by the at least one sensor in the form of a coil which varies its inductance value in response to the detected magnetic field of the two magnetic parts, whereby the coil is a frequency-determining component of an oscillator.

16 Claims, 4 Drawing Sheets

(56) References Cited

FOREIGN PATENT DOCUMENTS

| JP | 6318134 | A | 11/1994 |
| WO | 03054782 | A1 | 7/2003 |
| WO | 2006/130723 | A2 | 12/2006 |
| WO | 2006131520 | A1 | 12/2006 |

OTHER PUBLICATIONS

Abstract of DE19962789; Jul. 12, 2001.
Abstract of DE102010019596; Nov. 10, 2011.
Abstract of DE102010012247; Sep. 22, 2011.
Abstract of WO2006131520; Dec. 14, 2006.

\* cited by examiner

INPUT DEVICE WITH HAPTIC FEEDBACK

REFERENCE TO RELATED APPLICATION

This application claims priority to German application DE 10 2011 014 763.2 filed Mar. 22, 2011, the entire disclosure of which is hereby incorporated by reference.

FIELD OF INVENTION

The present invention relates to an input device with haptic feedback.

BACKGROUND OF THE INVENTION

Many devices or objects used in daily life are operated nowadays by input devices, such as electric switches, control levers, touch-sensitive screens (touchscreen), slide controls, keyboards and the like, in which the input occurs in the form of feedback via other sensory organs. If, for example, a cursor is to be controlled on a screen using a so-called mouse, the input occurs as a result of manual manipulation of the mouse, while the feedback occurs visually as a result of viewing the screen. When changing the volume on a radio, in many devices nowadays it is only a matter of holding a button down, whereby the length of time the button is pressed determines the degree of change in volume In this case, the feedback is acoustic.

In the case of a tactile input, it is desirable to receive a direct, haptic feedback wherein the tactile input (force, path, direction) is experienced directly as a tactile experience and not later via a potentially time-delayed system, such as for example, by way of a signal not directly connected to the input.

For this purpose magnetically positioned input elements are suitable.

U.S. Pat. No. 7,898,523 B1 discloses an input device consisting of two housings, each of which are closed, and which have surfaces in contact with one another and are held in contact by magnets. Arranged in one housing is a circuit board and an optical sensor which scans the contact surface of the other housing and generates an output signal that indicates the relative position of both housings relative to one another.

U.S. Pat. No. 6,762,748 B2 discloses a magnetic input device that includes a housing, the wall of which has an opening in which a displaceable magnet is mounted. The relative position of this magnet is detected by magnetic flux sensors.

U.S. Pat. No. 6,509,888 B1 discloses an input device with movable magnets and sensors in the form of coils. Displacement of the magnet induces a voltage in the coil which is evaluated.

DE 199 62 789 A1 discloses an actuation assembly for a window pane for a motor vehicle that includes a housing with an opening therein through which an actuating element protrudes, the element being coupled to a slide member that carries contact tabs which touch the contacts on a fixed circuit board.

EP 1 223 541 B1 describes an input device in the form of a remote control in which, for controlling a cursor on a display screen, a movable sliding part with a first magnet attached thereto is moved relative to a second fixed magnet, the resulting magnetic field being measured by Hall-sensors, from which the position of the movable sliding part can be determined. As a result of the interaction of both magnets the slidable part is moved to a predetermined position in the absence of an external force. Only through external force, for example, with the finger of an operator, is it possible to move the slidable part out of its idle position, wherein the force required for displacement is a function of the position of the magnets relative to one another, such that the user receives a tactile or perceptibly haptic feedback.

A third fixed magnet may also be provided, so that the slidable part can be moved between two idle positions. The displacement from both idle positions requires in each case an external force.

Further examples of input devices with magnets are known from the following documents:
DE 10117956 B4, DE 102005018275 A1,
DE 102007002189 A1, DE 202005019271 U1,
EP 0810544 A2, EP 1901005 A2,
JP 06318134 A, JP 2005004365 A,
U.S. Pat. No. 5,504,502 A, U.S. Pat. No. 7,187,360 B2,
U.S. Pat. No. 7,489,296 B2, US 2002/0054012 A1,
US 2002/0125977 A1, US 2004/0252104 A1,
US 2005/0068134 A1, US 2006/0209019 A1,
WO 03/054782 A1, WO 2006/130723 A2,
WO 2006/131520 A1 and WO 2008/016386 A2.

Most of the aforementioned documents use Hall sensors, which measure the magnetic flux density from which a signal for the position of the movable magnets can be derived.

In WO 00/70438 it is noted that Hall sensors are relatively expensive and are only capable of measuring the magnetic flux density, so that at least two Hall sensors are required for detecting the direction of movement of a magnet. Hence, this document proposes using sensors in the form of coils. When a magnet is moved relative to a coil, an electric voltage or current potential is induced in said coil, wherein a voltage pulse enables the direction of movement to be detected as well because the voltage pulse starts with a rising or falling edge depending on the direction of movement. The drawback of this device, however, is that it can detect only a movement but no static condition.

U.S. Pat. No. 5,698,976 A describes an input device having a plate made of a magnetic material, the surface of which, however, has regular geometric configurations but which differ in the X- and Y-direction in the form of depressions and peaks. A magnet is displaceable relative to this plate and a sensor in the form of a coil is moved in concert with said magnet. The magnetic flux varies as a result of the differing surface geometry of the plate, which variation is detected by the coil.

In the older, non-published German patent application DE 10 2010 012 247 an input device is described in which a magnetic operating part is displaceable in a sliding block guide along a housing wall. The relative position of the magnetic part is detected by sensors which comprise a coil that forms a frequency-determining component of an oscillator. A change in the position of the magnetic part alters the inductance value of the coil and with that the frequency of the oscillator.

In the older, non-published German patent application DE 10 2010 019 596, an input device is described in which a movable magnetic part is arranged along a circular path. Here, too, the magnetic part is displaceable relative to the housing wall to which it is pivotally attached. A sensor for the position of the movable magnetic part is provided also in the form of coils with an oscillator.

The problem with these devices is the attachment and operation of the movable magnetic parts on the housing wall. If the magnetic part is held in place solely by magnetic force, it can be removed and become lost. If it is attached to the housing wall by means of a sliding block guide or a swivel, the design itself is mechanically complex.

SUMMARY OF THE INVENTION

The object of the invention is to improve upon the device of the aforementioned kind to the extent that, with a minimum of expenditure, it delivers a precise electrical signal for the movement and/or position of the magnetic, movable input element, while simultaneously providing perceptible haptic feedback.

Briefly, therefore, the invention is directed to an input device comprising a housing, a circuit board, at least one magnetic part that is fixed relative to the housing, at least one magnetic part that is displaceable relative to the fixed magnetic part, at least one sensor for detecting the position of both magnetic parts relative to each other, a microprocessor which generates an output signal that indicates at least the position of both magnetic parts relative to each other, a cover wall of the housing, and other walls of the housing. The cover wall of the housing is displaceable relative to the other walls of the housing, in that the displaceable cover wall is mounted by way of slides in guide tracks that are fixed relative to the other housing walls. The circuit board is securely connected to the displaceable cover wall, and the at least one displaceable magnetic part and the at least one sensor are securely connected to the circuit board.

Other objects and features of the invention are in part apparent and in part pointed out hereinafter.

The basic concept of the invention lies in designing a housing wall that is displaceable relative to all other house walls. This wall is therefore the input element. Attached to said wall is a magnetic part and a circuit board with at least one sensor. The circuit board is therefore displaceable in (common) concert with the housing wall. Also arranged on the displaceable housing wall is at least one button, which together with switch contacts on the circuit board can trigger switching functions.

BRIEF DESCRIPTION OF THE DRAWINGS

Further details and advantages of the invention are set out in the following description of the various exemplary embodiments of the invention, which are discussed in greater detail with reference to the drawing. In the drawings.

DETAILED DESCRIPTION OF PREFERRED EXEMPLARY EMBODIMENTS OF THE INVENTION

Figure 1:
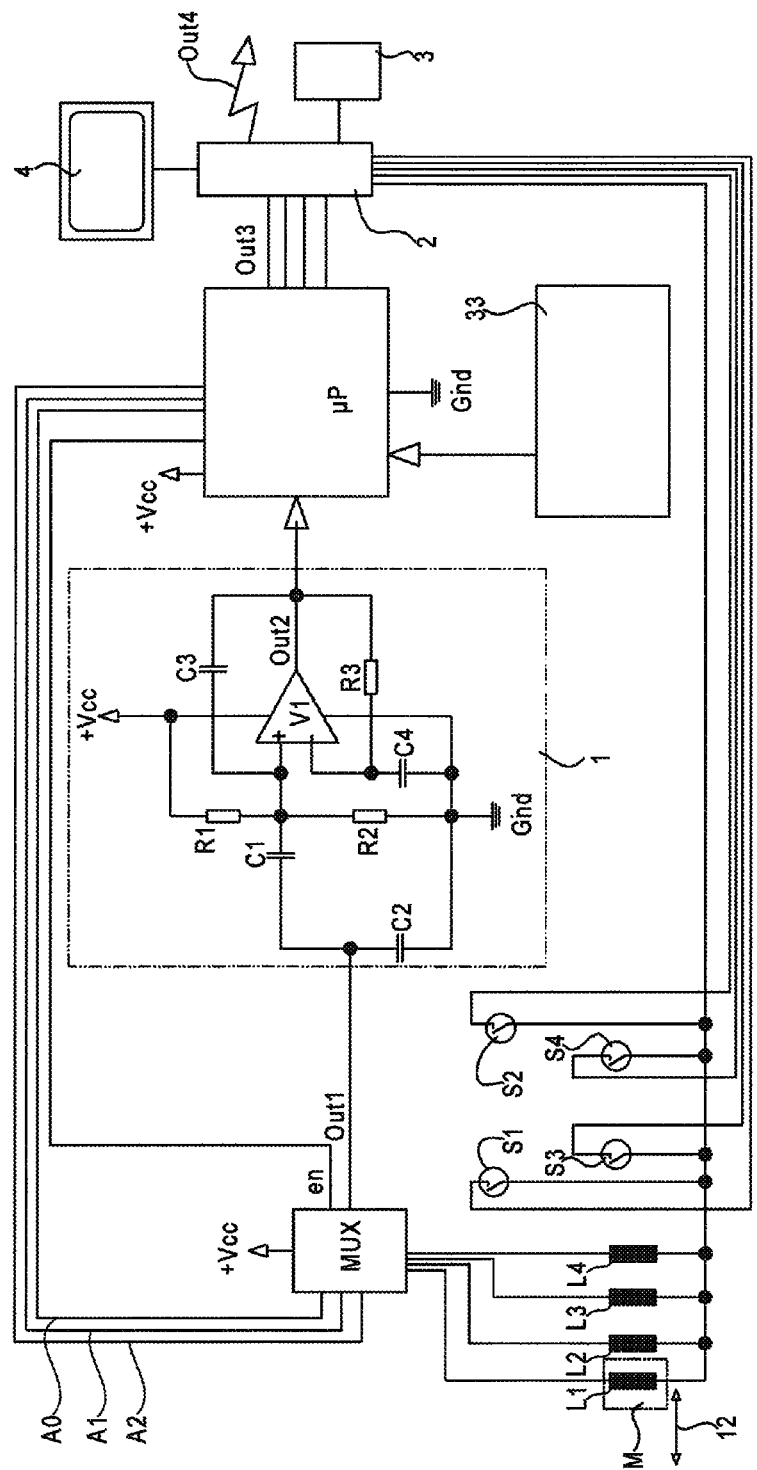
FIG. 1 is a circuit diagram of the inventive device in accordance with an exemplary embodiment of the invention.

In the circuit diagram of FIG. 1 four inductances L1 to L4 may be seen, wherein each individual inductance shown represents a coil which functions as a sensor for the position of a magnetic part M that is displaceable relative to the coil. The inductances L1 to L4 are connected to a multiplexer MUX. The multiplexer MUX is activated by a microprocessor μP via an enable-input en, whereby individual inputs of the multiplexer are selected by way of address lines A0, A1 and A2 and are enabled at the output OUT1 of said multiplexer MUX. The output OUT1 of said multiplexer MUX is forwarded to an oscillator 1, which is constructed as follows:

An operational amplifier V1 is connected at its positive input (+) to a potentiometer consisting of resistors R1 and R2, disposed between a supply voltage +Vcc and ground (Gnd), wherein the connection point common to the resistors R1 and R2 is connected by way of a first capacitor C1 with the output OUT1 of the multiplexer MUX. This connection point is connected by way of a second capacitor C2 to ground. Further, the positive input of the positional amplifier V1 is connected to the output of the operational amplifier V1 by way of a feedback capacitor C3. The negative input of the operational amplifier is connected with the output of the operational amplifier V1 by way of a resistor R3 and to ground by way of a capacitor C4.

Thus, with each enabled input of the multiplexer, the selected inductances L1 to L4 and capacitor C2 are connected in parallel between ground and the positive input of the operational amplifier V1, and thereby form a LC component of an oscillating circuit or oscillator 1 completed by the operational amplifier, said LC component being connected with the positive output of the operational amplifier V1 by way of coupling capacitor C1.

At output OUT2 of the operational amplifier V1, therefore, a signal occurs whose frequency is a function of the respective values of the LC component. The inductance value of the inductances L1 to L4 is changed by a magnetic part, such as a magnet M, which is moved into the vicinity of the inductances formed by the coils, so that in the end the frequency of the signal issued at output OUT2 is a function of the relative position between a magnetic part M and the coils L1 to L4.

The output signal at the output OUT2 is forwarded to the microprocessor μP, where it is evaluated and, depending on the application, output as a control signal at the output OUT4.

The output OUT3 of the microprocessor μP can be either a serial or parallel digital output or an analog output which, depending on the purpose, is forwarded to driver circuits 2 and/or actuators 3 and, optionally also to display 4. The driver circuit can also have a wireless output OUT4, by way of which an infrared signal, a radio signal or an ultrasound signal is output. In this arrangement, the driver circuit 4 includes a corresponding transmitter for such wireless signals.

The microprocessor μP is able to evaluate both the frequency and the time-related variation in frequency, and can thus not only output a signal that marks the position of the magnet M relative to the individual coils L1 to L4, but also the rate of movement of the former.

Depending on the rate of movement of the magnetic part M, it is possible to accelerate or slow the reproduction of the image on the display 4, which has the added interesting effect that the subjective experience of the user is altered with regard to haptic feedback of the force of the magnet M by the change in rate of imaging. It was discovered the haptic experience is impacted by an additional visual representation. This function is realized by a software in the microprocessor.

In addition, four switches S1, S2 S3 and S4 can be seen in FIG. 1, each of which is connected to the driver circuit 2 as well as to ground. In place of switches S1-S4, coils may also be provided which, like the coils L1 to L4, are connected to the multiplexer MUX and to ground.

In the first case, each switch S1-S4 is activated by a button or plunger which bridges switch contacts on a circuit board. In the second case, a magnet can be attached to the button or plunger which, when the plunger is pressed down, changes the inductance value of the respective coil, and when the corresponding coil is queried, is evaluated by the multiplexer by way of the oscillator 1, then fed to the microprocessor μP.

According to an exemplary embodiment of the present invention, one of the electronic components is a position sensor 33 and/or an acceleration sensor and/or gyroscope which can determine the position of the housing relative to the earth's surface. This sensor, referred to hereinafter simply as position sensor 33, outputs a signal to the microprocessor µP of FIG. 1, which indicates which of the walls 6 to 11 of the housing 5 points "upward", that is points away from the earth's surface. In response to this signal the microprocessor µP can assign various functions to the output signals OUT 3 of the microprocessor µP and, optionally, to the output signals of the switches S1 to S4.

If, for example, the cover wall 11 points upward and said wall is moved in the direction of the arrow 12, this can be interpreted as a command to "scroll" in the vertical direction. On the other hand, if one of the side walls 9 and 10 points upward, this can be interpreted as "scrolling" in the horizontal direction.

If the cover wall 11 points downward and the bottom wall 6 points upward, this can generate a signal without moving the cover wall which switches off a control device.

Analogously, positions in which one of the end walls 7 or 8 points upward can be allocated other predetermined functions.

The speed of the aforementioned "scrolling" is determined by the displacement of the cover wall 11 whereby, as a result of the aforementioned magnetic force, a perceptible haptic feedback is also generated.

Figure 2:
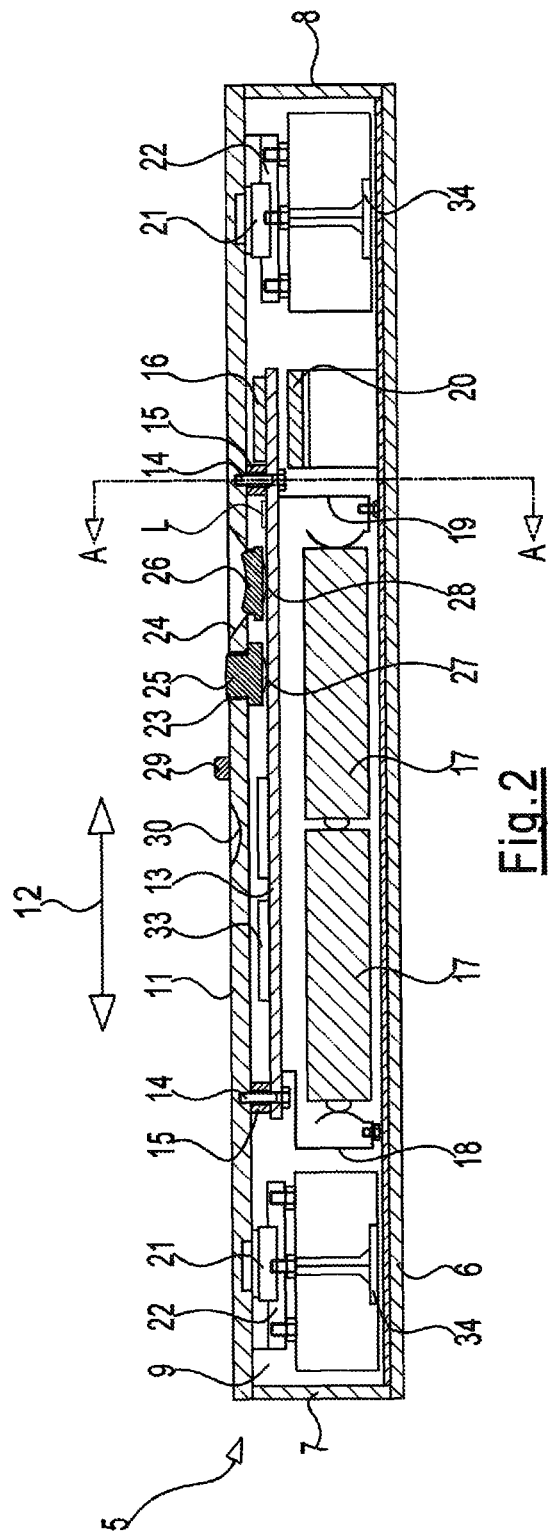
FIG. 2 is a longitudinal section of the input device according to a first exemplary embodiment of the invention.

FIG. 2 is a cross-section of an input device according to an exemplary embodiment of the present invention. The input device has a rectangular-shaped housing 5 with six walls, namely a bottom wall 6, two end walls 7 and 8, two side walls 9 and 10 (FIG. 3) and a cover wall 11. The complete cover wall 11 can be displaced linearly relative to the other walls 6 to 10 in the direction of the arrow 12.

Attached to the cover wall 11 is a circuit board 13, said attachment realized here in the form of screws 14 and spacer sleeves 15. Mounted on the circuit board 13 are all the electrical and electronic components, that is in particular, the coils L1 to L4, the switches S1 to S4, the multiplexer MUX, the oscillator 1, the position sensor 33 and the microprocessor µP of FIG. 1. Also affixed to the circuit board 13 is a magnetic part 16. The magnetic part can be a permanent magnet, an electromagnet or a non-magnetized element made of a ferromagnetic material.

Electric power supply is made to all the components on the circuit board 13 by batteries 17 and by flexible electrical conductors 18 and 19 which are connected to the batteries and the conductor plate 13. The batteries 17 are disposed in a battery holder 31, 32 (FIG. 3) which is fixed in place relative to the walls 6 to 10 of the housing 5.

Arranged opposite the magnetic part 16 on the circuit board 13 is a second magnetic part 20 which is fixed in place relative to the bottom wall 6. At least one of the two magnetic parts 16, 20 is a magnet, in particular a permanent magnet, while the other magnetic part can be either a permanent magnet or an element made of a ferromagnetic material. It is understood that both magnetic parts can also be permanent magnets.

The cover wall 11 is connected with multiple slides that are movable along guide tracks 22, wherein in an exemplary embodiment of the invention the guide tracks 22 are connected to the bottom wall 6.

In this embodiment, the cover wall 11 has two openings 23 and 24 into which plungers 25 and 26 are inserted which constitute buttons for the switching functions. In the exemplary embodiment shown, the plungers 25 and 26 have switching domes 27 and 28 of conventional type which, when activated, contact and thereby enable switch contacts on the circuit board 13.

To allow for better gripping of the movable cover wall 11, said wall can include an outwardly directed projection 29 or an inwardly facing grip recess 30. Alternatively, at least a portion of the outwardly facing surface of the cover wall 11 can be roughened or enhanced with a riffling to improve the "grip".

At least one of the two magnetic parts 16 and 20 is magnetized so that both magnetic parts exert a reciprocal attraction on one another, and thereby move the cover wall 11 together with the circuit board 13 into the "neutral" position shown in FIG. 2. If the cover wall 11 is displaced in the direction of the arrow 12, a perceptible, haptic counterforce is generated by both magnetic parts 16 and 20, the magnitude of which is a function of the displacement path. At the same time, the magnetic field of both magnetic parts 16 and 20 is sensed by at least one of the coils L1 to L4 on the circuit board 13, causing a variation in the corresponding inductance value with the result that the output frequency of the oscillator is changed depending on the relative position of the cover wall 11 relative to the rest of the housing 5.

Since the circuit board 13 and the plungers 25 and 26 move in concert with cover wall 11, it is possible in any position to which the cover wall is moved to activate one of the plungers 25 and thus the corresponding switch.

Figure 3:
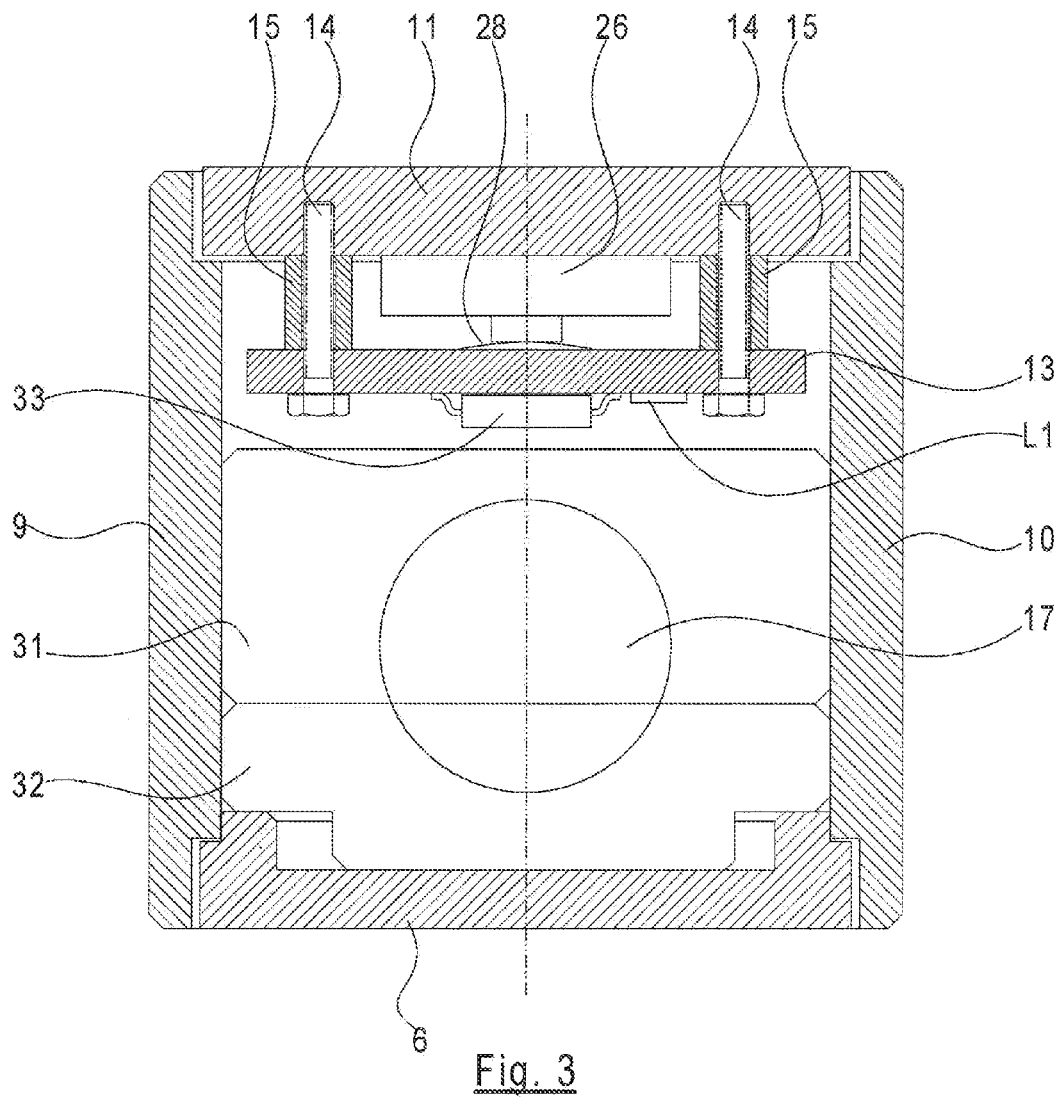
FIG. 3 is a cross-section of the input device along the line A-A of FIG. 2.

FIG. 3 shows a section along the line A-A of FIG. 2. Visible here are the two side walls 9 and 10 as well as the bottom wall 6 and the movable cover wall 11 to which the circuit board 13 is affixed by means of the screws 14 and spacer sleeves 15. Also visible is an upper battery holder 31 and a lower battery holder 32. To replace the battery the bottom wall 6 held in place on the housing by the magnetic parts 34 (FIG. 2) can be removed. Further visible in FIG. 3 is the plunger 26 and the switching dome 28 which is activated by the plunger 26. Also indicated is a coil L1 and the position sensor 33.

Because the entire cover wall 11 together with the circuit board 13 and the plungers 25, 26 is displaceable, the "buttons" formed by plungers are accessible in any position to which the cover wall 11 is moved. By displacing the entire cover wall 11 relative to the rest of the housing, the user receives a better haptic experience in addition to a visual experience, as compared to moving a control button relative to a housing wall as is known in the prior art.

Figure 4:
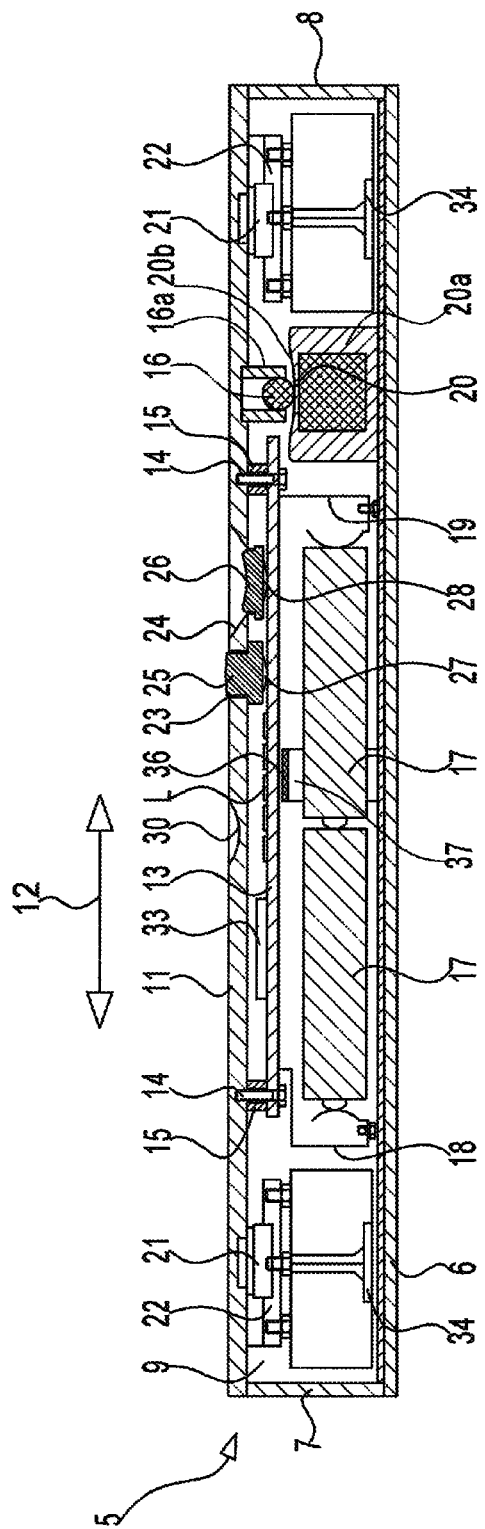
FIG. 4 is a longitudinal section of the input device according to a second exemplary embodiment of the invention.

FIG. 4 shows a second exemplary embodiment of the present invention. This embodiment differs from the embodiment described above essentially in that the fixed magnet 20 is rectangular in shape and is connected to the housing bottom 6 via a holder 20a. The other magnet 16 is a cylindrical magnet mounted in a sleeve 16a and can be rotated. The upper side of the holder 20b directed toward the magnet 16 can have a concave recess 20b on which the magnet can roll off. This concave recess 20b allows for improved centering of the neutral position.

The coils L mounted on the circuit board 13 are arranged opposite a third magnetic part 36, which is held in place in the housing via a holder 37, in this case with the holder being connected to the bottom wall 6. This magnetic component and the magnetic components discussed above are denoted as "ferromagnetic" by which it is understood that the material in general exhibits the phenomena of hysteresis and saturation and thus has the property to influence magnetic fields; such materials being, for example, Fe, Ni, Co, rare earth elements as well as their alloys. Since the coils L, when energized by the oscillator, generate their own magnetic field, it is possible to also change the inductance value of the coils L with component 36 being alternatively a non-magnetized material part which, however, affects the inductance of the sensor coils L. This material is denoted above as "ferromagnetic material". It is understood that this material does not necessarily comprise iron (F2) but has the property to influence magnetic fields. Known materials are also nickel (Ni), cobalt (Co) and rare earth compounds as well as their alloys. Therefore, the magnetic part 36 needed for sensing the relative position of the cover wall 11 in connection with the coils does not have to be connected to the magnets 16 and 20 since both magnets 16 and 20 are arranged far enough away from the coils L that their magnetic field no longer affects the coils L. On the other hand, since the coils L and the magnet 16 move together with the cover wall 11, the coils L also detect indirectly the position of both magnets 16 and 20 relative to one another.

Finally, it is noted that the slides 21, by means of which the displaceable cover wall 11, unlike the other walls, is mounted on fixed guide tracks 22, can be configured so that the cover wall 11 can be moved linearly relative to the rest of the housing 6-10 in the direction of arrow 12, but cannot be removed from said housing. Thus, the guide tracks 22 can be configured to be non-detachable relative to the housing, for example, by replacing the magnets 34 with screws which affix the guide tracks 22 to the housing. In this case, it is necessary to provide a battery compartment cover in a manner known in the art.

The invention claimed is:

1. An input device comprising:
    a housing,
    a circuit board,
    at least one magnetic part that is fixed relative to the housing,
    at least one magnetic part that is displaceable relative to the fixed magnetic part,
    at least one sensor for detecting the position of both magnetic parts relative to each other,
    a microprocessor, which generates an output signal that indicates at least the position of both magnetic parts relative to each other,
    a cover wall of the housing, and
    other walls of the housing,
        wherein the cover wall of the housing is displaceable relative to the other walls of the housing,
        in that the displaceable cover wall is mounted by way of slides in guide tracks that are fixed relative to the other housing walls,
        wherein the circuit board is securely connected to the displaceable cover wall, and
        wherein the at least one displaceable magnetic part and the at least one sensor are securely connected to the circuit board.

2. The input device according to claim 1, wherein at least one button is mounted in the cover wall for displacement relative to said cover wall, and wherein switching elements which can be activated by the buttons are arranged on the circuit board.

3. The input device according claim 1 wherein the at least one sensor is a coil mounted on the circuit board, wherein the coil is connected to an oscillator whose output signal has a frequency that is a function of the position of the two magnets relative to each other, and wherein the output signal of the oscillator is connected to the microprocessor.

4. The input device according claim 2 wherein the at least one sensor is a coil mounted on the circuit board, wherein the coil is connected to an oscillator whose output signal has a frequency that is a function of the position of the two magnets relative to each other, and wherein the output signal of the oscillator is connected to the microprocessor.

5. The input device according to claim 1 wherein a position sensor is connected to the microprocessor which generates a signal indicating the position and/or orientation of the housing in space, and in that the microprocessor, in response to this signal, modifies the output signal which indicates the position of the two magnetic parts relative to each other.

6. The input device according to claim 2 wherein a position sensor is connected to the microprocessor which generates a signal indicating the position and/or orientation of the housing in space, and in that the microprocessor, in response to this signal, modifies the output signal which indicates the position of the two magnetic parts relative to each other.

7. The input device according to claim 1 wherein the output signal of the microprocessor is forwarded to a driver circuit, wherein the driver circuit includes a transmitter for emitting a wireless signal.

8. The input device according to claim 1 wherein an outwardly facing surface of the displaceable cover wall includes a projection, a grip recess or a roughened surface.

9. The input device according to claim 1 wherein a first magnetic part is attached to the displaceable cover wall, a second magnetic part is attached to the housing, of which at least one is a permanent magnet, and a third magnet is arranged opposite the at least one sensor.

10. The input device of claim 9 wherein the third magnetic part is a permanent magnet.

11. The input device of claim 9 comprising a non-magnetized element which affects the inductance of the sensor coils.

12. The input device according to claim 9, wherein the first magnetic part is a cylindrical magnetic part which is rotatably guided in a guide and can roll off on a concave surface of a holder of the second magnetic part.

13. The input device according to claim 12, wherein the guide permits movement of the first magnetic part perpendicular to the direction of movement of the displaceable cover wall.

14. The input device according to claim 1, wherein:
    at least one button is mounted in the cover wall for displacement relative to said cover wall,
    switching elements which can be activated by the buttons are arranged on the circuit board,
    the at least one sensor is a coil mounted on the circuit board, the coil is connected to an oscillator whose output signal has a frequency that is a function of the position of the two magnets relative to each other,
    the output signal of the oscillator is connected to the microprocessor,
    a position sensor is connected to the microprocessor which generates a signal indicating the position and/or orientation of the housing in space, and the microprocessor, in response to this signal, modifies the output signal which indicates the position of the two magnetic parts relative to each other,
    the output signal of the microprocessor is forwarded to a driver circuit, wherein the driver circuit includes a transmitter for emitting a wireless signal, and
    a first magnetic part is attached to the displaceable cover wall, a second magnetic part is attached to the housing, of which at least one is a permanent magnet, and a third magnet is arranged opposite the at least one sensor.

15. The input device according to claim 14, wherein the first magnetic part is a cylindrical magnetic part which is rotatably guided in a guide and can roll off on a concave surface of a holder of the second magnetic part.

16. The input device according to claim 14, wherein the guide permits movement of the first magnetic part perpendicular to the direction of movement of the displaceable cover wall.

* * * * *